(12) United States Patent
Kocon (10) Patent No.: US 6,285,056 B1
(45) Date of Patent: Sep. 4, 2001

(54) CONDUCTIVITY ENHANCED MOS-GATED SEMICONDUCTOR DEVICES

(75) Inventor: Christopher Boguslaw Kocon, Plains, PA (US)

(73) Assignee: Intersil Corporation, Palm Bay, FL (US)

(*) Notice: Subject to any disclaimer, the term of this patent is extended or adjusted under 35 U.S.C. 154(b) by 0 days.

(21) Appl. No.: 09/114,769

(22) Filed: Jul. 14, 1998

(51) Int. Cl.⁷ .................................................... H01L 29/76
(52) U.S. Cl. ........................ 257/328; 257/333; 257/339; 257/577
(58) Field of Search .................................... 257/228, 229, 257/262, 263, 332, 334, 359, 577, 582, 328, 335, 39

*Primary Examiner*—Fetsum Abraham
(74) *Attorney, Agent, or Firm*—Jaeckle Fleischmann & Mugel, LLP (57) ABSTRACT

The resistance to current flow through an MOS-gated semiconductor device is reduced by providing a high conductivity region in the path of current through the drain region, but so positioned relative to the p-n voltage blocking junction of the device so as not to adversely affect the voltage blocking capability of the p-n junction. In one embodiment, the drain region is made of higher than normal electrical conductivity, but a diffused, graded p-n junction is provided for extending the low conductivity portion of the drain region bordering the p-n junction further than usual into the drain region.

7 Claims, 6 Drawing Sheets

CONDUCTIVITY ENHANCED MOS-GATED SEMICONDUCTOR DEVICES

BACKGROUND OF THE INVENTION

This invention relates to semiconductor devices and, particularly, to semiconductor power devices of the MOS-gated type designed in view of avalanche breakdown considerations.

By "MOS-gated" type is meant semiconductor devices including a gate control structure comprising a gate electrode overlying, but dielectrically isolated from, a first surface of a semiconductor substrate including, at the surface, source and drain regions separated by a channel region. Operation of the devices is under control of voltages applied to the gate electrode for controlling the conductivity of a path for current through the channel region between the source and drain regions. While a number of different types of MOS-gated devices now exist, e.g., insulated gate bipolar transistors (IGBTs) and MOS controlled thyristors (MCTs), and while the present invention can be used in all such devices, the greatest utility of the invention is in "unipolar" devices, particularly, metal-oxide-semiconductor field-effect transistors (MOSFETs). In such unipolar devices, only one type of majority charge carriers (holes or electrons) is present, and the resistivity of the device semiconductor material is relevant to device performance. As described hereinafter, the invention enables higher conductivity devices.

Additionally, the invention has greatest utility in devices where the drain region extends to the substrate first surface for being disposed between oppositely disposed channel "regions" (which may be part of a common annular channel region), and where the drain region voltage is applied to the drain region at a position beneath the channel region(s). The portion of the drain region adjacent to the substrate first surface and between the oppositely disposed channel regions is referred to as the drain "neck".

Avalanche breakdown in semiconductor devices is well-known and occurs when charge carriers arriving at a reverse biased p-n junction are accelerated by the field in the junction depletion region and receive enough energy so that, in collisions with the substrate lattice, the charge carriers ionize electrons and holes which repeat the process and lead to large current flow across the otherwise reverse biased junction. The reversed biased junction of concern to the present invention is the p-n junction between the channel region and the drain region which must withstand the voltage difference between the device source and drain regions when the device is in its current non-conducting, voltage blocking (off) condition.

In general, higher avalanche breakdown capability is provided by the use of higher resistivity (lower doped) semiconductor materials adjoining the p-n junction. Typically, in devices of the type under consideration, such junctions are "abrupt" junctions, (e.g., $p^+$-$n^-$), where substantially the entire voltage drop occurs across a high resistivity semiconductor region on the drain side of the p-n junction. A problem with this, however, is that the higher the resistivity of the semiconductor material, particularly in unipolar devices where the current density is generally not sufficiently high for "conductivity modulating" the resistivity of the material (in effect, negating it), the higher are the voltage drop across the device and the $I^2R$ heating of the device. Preferably, such parameters should be as low as possible and the present invention is directed to this goal.

SUMMARY OF THE INVENTION

Typically, as described hereafter, certain portions of the drain region of MOS devices where the drain region adjoins the channel region p-n junction "support" little or any of the reverse biasing voltage applied across the p-n junction. In accordance with this invention, such drain portions (and particularly the aforedescribed drain neck) are made to have higher conductivity than is normally present in known devices. This is accomplished by increasing (in comparison with known devices) the conductivity of the material of the device in which the aforementioned drain portions are to be formed. For reducing the otherwise adverse effects this would have on voltage breakdown capability, the p-n junction thereafter formed between the channel and the drain region is a "graded" (e.g., p-$n^-$) junction rather than the aforementioned "abrupt" ($p^+$-$n^-$) junction. Reasons for this are hereafter explained.

DESCRIPTION OF PREFERRED EMBODIMENTS

As previously described, the invention has principal (but not exclusive) utility in unipolar devices of the MOSFET type. Although structural details vary from device to device, in power devices it is common to provide a plurality of identical gate electrode structures in parallel, side-by-side relationship over the surface of a semiconductor wafer. In the embodiment shown in FIGS. 1 and 2, a single gate electrode structure 10, and portions of adjacent such gate structures are shown; each such gate electrode structure 10 comprising an elongated (FIG. 1) gate electrode 12 of conductive material, e.g., doped polycrystalline silicon, spaced apart (FIG. 2) from a surface 14 of a semiconductor substrate 24–24a, e.g., of silicon, by a relatively thin layer 18 of insulating material, e.g., silicon dioxide (referred to as the "gate oxide layer"). The gate electrode 12 directly overlies (along each side of the gate electrode 12) a channel region 20 of one conductivity type, p type in this example, disposed between a source region 22 and a drain region 24. The source and drain regions are of a conductivity type opposite to that of the channel region 20, and are of n type in this embodiment. The gate electrode 12 extends over the source 22 and drain 24 regions.

Figure 2:
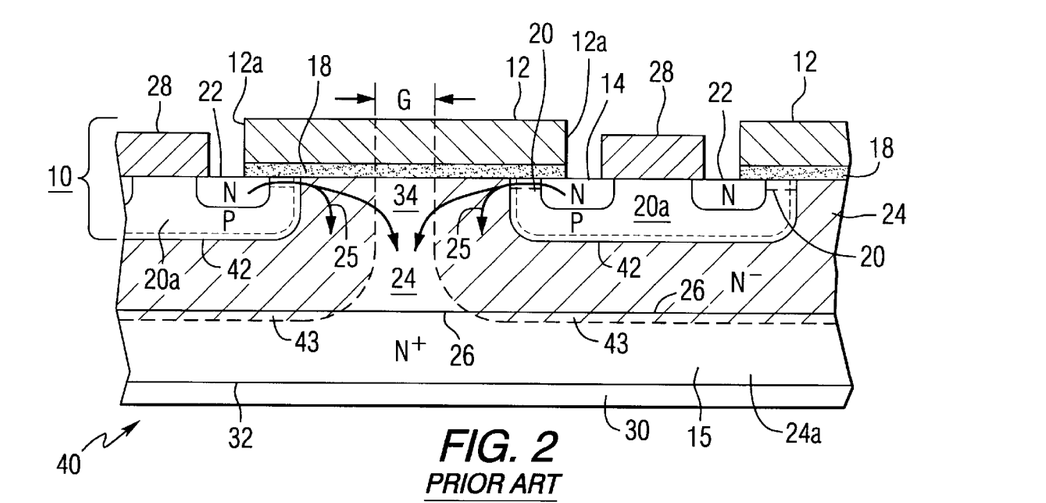
FIG. 2 is a section taken along line 2—2 of FIG. 1.

Electrical connections are provided for applying voltages to various parts of the devices and different arrangements are used depending upon the particular device structure. In one common arrangement, in which the invention has particular utility, the channel region 20 is part of a larger "body" region 20a in which is disposed the source region 22. (As shown in FIG. 2, each body region 20a includes two spaced apart source regions 22 each defining a respective channel region 20 controlled by a respective gate electrode 12.) A common electrical connection is made to the source 22 and body 20a regions by means of a layer 28 of metal referred to as the source electrode.

The body region 20a, in which is disposed the two channel regions 20, is referred to as a "well" formed within the drain region 24 which completely surrounds the various body regions 20a within the substrate. The drain region 24 extends downwardly below the body regions 20a and adjoins an underlying portion 24a of the substrate 16. The portion 24a, which adjoins the drain region 24 at an interface 26, forms an extension of the drain region 24 as hereinafter explained. The portion 24a is electrically connected to a metal electrode 30 on a surface 32 of the portion 24a opposite to the surface 14. The drain region 24 extends between adjacent body regions 20a to the substrate surface 14. Each upwardly extending portion 34 of the drain region is referred to as the drain "neck".

In other MOS-gated devices, the drain region 24 (including the portion 24a) is connected to the underlying electrode 30 through one or more intervening doped regions, as generally known. As mentioned, a typical discrete MOS-gated power device comprises a plurality of parallel connected gate electrode structures 10 of the type shown in FIGS. 1 and 2 disposed in side-by-side relation over the substrate 24,24a. The drain region 24 extends beneath and is common to all the gate electrode structures.

FIG. 2 indicates how the device 40 (as well as other MOS-gated devices) operates both in the conductive, "on" state, and in the voltage blocking, "off" state. In the "on" state, charge carriers flow through each channel region 20 between the source 22 and drain 24 regions under the control of voltages applied to the gate electrode 12 relative to the source region 22. In the herein illustrated device 40 having a p-type channel region 20 disposed between n-type source 22 and drain regions 24, a positive voltage is applied to the gate electrode 12 for attracting electrons towards the surface of the channel region. The thus attracted electrons, when of sufficient concentration, invert the conductivity type of a narrow portion of the p-type channel region adjacent to the substrate surface 14 to n-type for establishing a continuous path of n-type conductivity from the source region 22 through the channel region 20 to the drain region. Current (electrons) flows through the n-type channel when a positive voltage is applied to the drain region 24 relative to the source region 22. The current enters the drain region 24 near the top surface 14 of the substrate and then flows (as indicated by the arrows 25 in FIG. 2) downwardly through the drain region layer 24 to the underlying drain region layer 24a of quite high conductivity. The drain region layer 24 is of relatively low conductivity and electrical losses occur therein.

In the absence of a conductivity type inverting voltage on the gate electrode, a current path is not established through the channel region 20 and the device is in its off-state. If the voltage on the drain region 24 is positive while the device is off, the p-n junction 42 between the n-type drain region 24 and the p-type body region 20a is reverse biased, and the voltage difference between the drain region 24 and the source region 22 appears across the reverse biased junction 42. A depletion region 43 (shown shaded in FIG. 2) adjoins each p-n junction 42. In FIG. 2, the depletion region 43 is shown in the condition when the device is undergoing avalanche breakdown. The avalanching condition is further discussed hereinafter.

The device 40 is designed to withstand a certain rated source to drain voltage when the device is in its off-condition and, to this end, the dimensions and doping profiles of the device regions are selected in accordance with well known design parameters for avoiding avalanche breakdown of the reverse biased junction 42 for applied voltages less than the device rated voltage. Avalanche breakdown is now well understood and, in general, avalanche breakdown is avoided by the use of low doping levels in those portions of the drain region 24 where it forms the p-n junction 42 with the body region 20a. How the doping levels are selected is described hereinafter.

Figure 1:
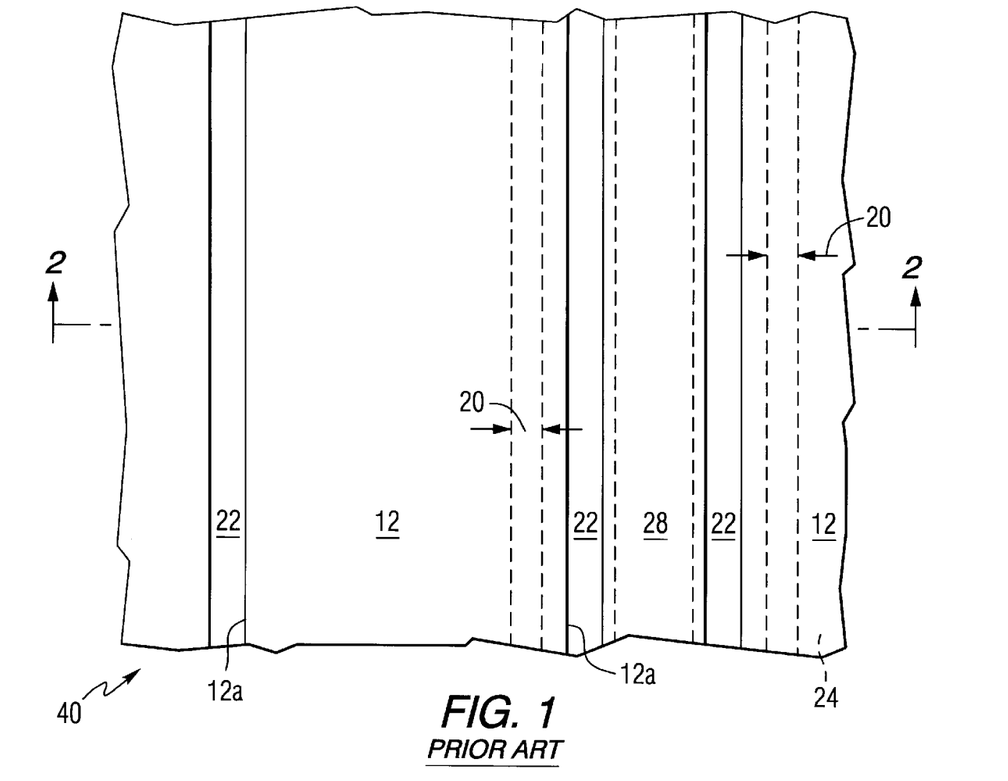
FIG. 1 is a plan view of a portion of a substrate of a known MOSFET type semiconductor device.

Relevant to the present invention is how the device shown in FIGS. 1 and 2 is fabricated. This is now described in connection with FIGS. 3 through 5. In these figures, only portions of the device 40 shown in FIGS. 1 and 2 are illustrated.

The starting workpiece (FIG. 3) comprises a silicon precursor substrate 24a of uniformly high (e.g, n+) conductivity on which has been deposited a uniformly lightly doped (n⁻) epitaxial layer 24. The dopants present in the layer 24, as deposited, are referred to as "background" dopants. The layer 24 also forms the aforementioned drain region 24. As described hereinafter, the doping concentrations vary within the drain region and are a function of the "background" doping concentration (i.e., the doping present in the layer 24 as it is epitaxially grown) modified by dopants later added to the drain region, e.g., by known ion implantation and subsequent diffusion. As initially provided, the precursor substrate 24a is doped with phosphorous or arsenic at a uniform concentration of $2 \times 10^{19}$ atoms/cm³, and the layer 24 is doped with phosphorous at a uniform concentration of $2.8 \times 10^{16}$ atoms/cm³.

A thin gate oxide layer 18 (e.g., silicon dioxide) overlies the surface of the layer 18 and an electrically conductive material layer 12 (e.g., heavily doped polycrystaline silicon) overlies the gate oxide layer 18. Then (FIG. 4), the upper layers 12 and 18 are patterned (by photolithography) into a plurality of side-by-side elongated gate electrodes 12, only of one of which is shown in FIGS. 1 and 2. Of importance, as is hereafter further discussed, is that the accuracy required in the alignment of the photomask used to define the various gate electrodes 12 on the substrate layer 24 is relatively low. This is because, at the time of patterning the upper layers 12 and 18, the underlying layer 24 is "featureless" in that it is everywhere uniformly doped. Conversely, once the gate electrodes are in place, an advantage of a known self-alignment process now to be performed is the extremely high precision obtainable.

The next step (FIG. 4) is to ion implant p type dopants (e.g. baron) into the substrate layer 24 where the substrate surface 14 is exposed by the gate electrode 12. The edge 46 of the two regions 20c (shown by dash lines in FIG. 4) where the ions are implanted is precisely defined by the edges 48 of the gate electrode 12. Then, in a precisely controlled heating step, the implanted impurities are caused to diffuse both downwardly and laterally within the substrate layer 24 for moving the region edges 46 to the positions shown at 42 (the aforementioned p-n junction) beneath the gate electrode 12. As known, when two dopants are present within any region of a semiconductor device, the conductivity type of the region is that of the dopant of the higher concentration, and the actual electrical conductivity of the region is determined by the net difference of concentrations of the two dopants. The p-n junction 42 between the diffused p type region 20a (the aforementioned p well) and the underlying n type region 24 is where the concentrations of both types of dopants are equal. In portions of the n type region 24 adjoining the p-n junction 42, p type dopants are present, but at a concentration less than the n type background dopants present and at decreasing concentrations with distance away from the p-n junction 42.

After the formation of the diffused p type region 20a, n type dopants (e.g. phosphorous) are then implanted (FIG. 5) into the p regions 20a again using the gate electrode as a mask for precisely positioning the edges of the thus formed implanted n regions. The concentration of the newly implanted n type dopants added to the n type dopants originally present in the layer 24 greatly exceeds the concentration of the previously implanted p type dopants for providing two n type regions 22a shown by dash lines in FIG. 5.

Figure 5:
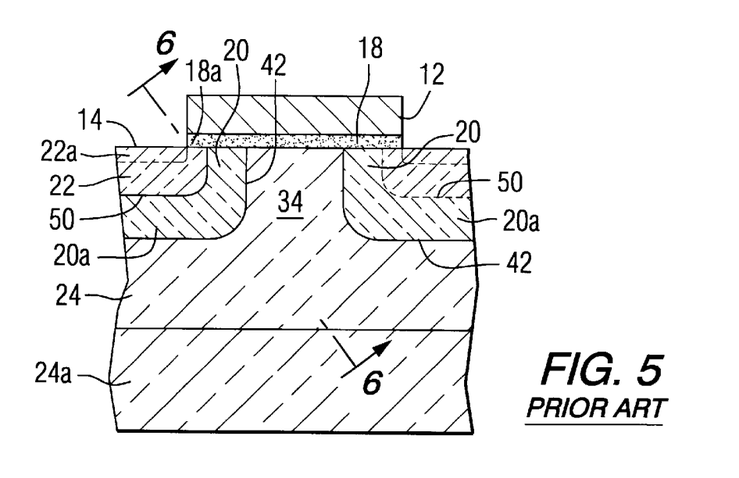

The regions 22a are then precisely diffused laterally and downwardly within their respective p regions 20a to provide the aforementioned source regions 22 extending beneath the gate electrode 12 and forming p-n junctions 50 with the p regions 20a. The portions 20 of the p regions 20a adjacent to the surface 14 of the substrate between the p-n junctions 42 and 50 are the aforementioned channel regions. Of importance, because each channel region 20 and its corresponding source region 22 is precisely positioned relative to one another (both having been formed using the gate electrode as an implantation mask), the lengths of the channel regions 20 are likewise extremely precise. Similarly, because the drain region neck portion 34 is defined by the precisely formed p regions 20a, the drain neck now formed in the previously featureless layer 24 is precisely positioned within the gate electrode structure 10.

Figure 6:
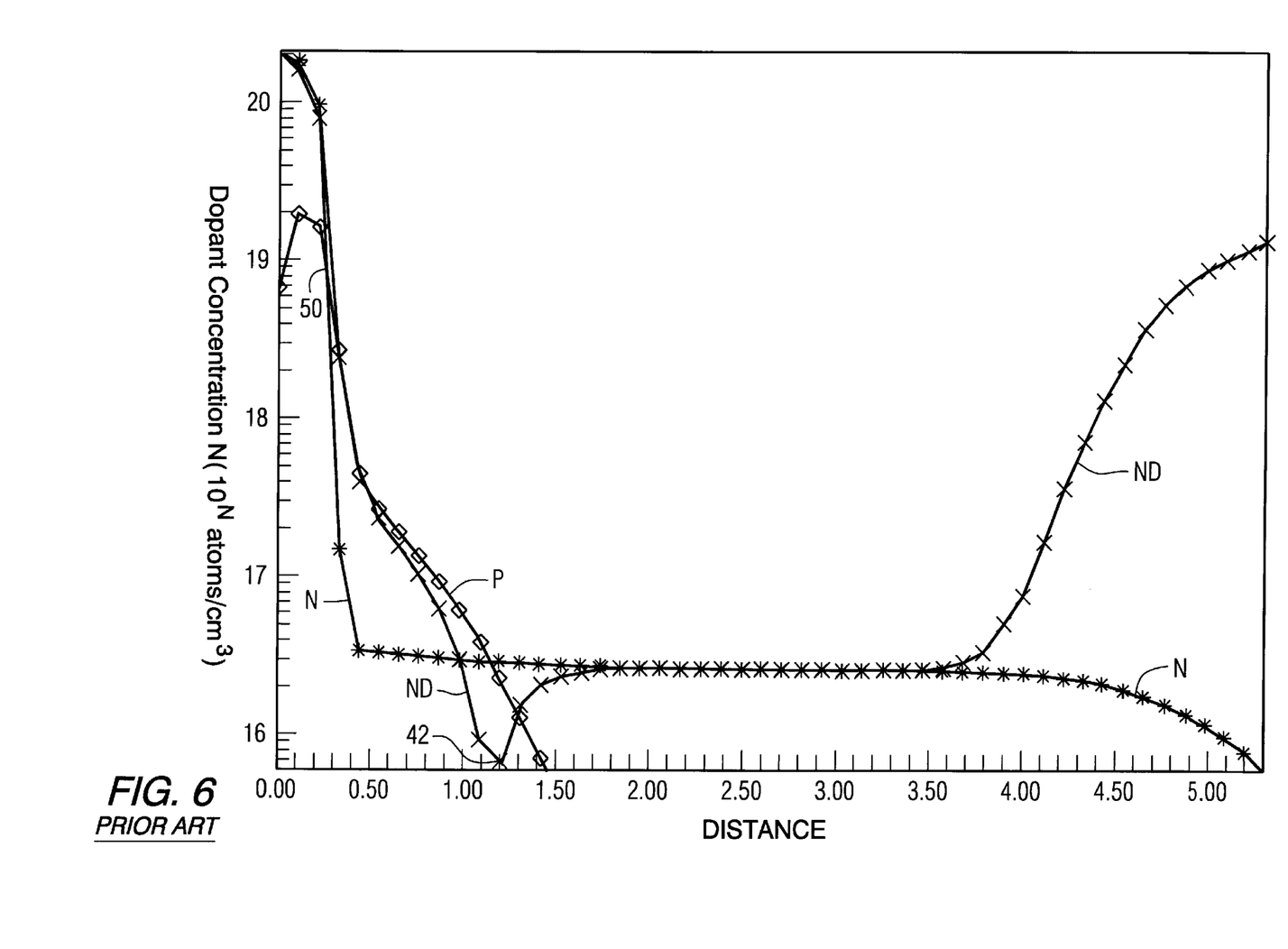
FIG. 6 is a graph plotting the actual and net doping concentrations along a line 6—6 shown in FIG. 5.

As described, the various doped regions within the originally uniformly doped layer 24 are formed by selective ion implantation followed by diffusion, and the dopant concentrations vary throughout the layer 24. FIG. 6 shows a graph of the dopant concentrations present within the device along a line 6—6 shown in FIG. 5, where the graph y coordinate is the exponent n ($10^n/cm^3$) and the x coordinate is distance from the intersection of the line 6—6 (FIG. 5) with the bottom edge 18a of the oxide layer 18 underlying the gate electrode 12.

In FIG. 6, the concentrations of n and p dopants and the net differences between the two are shown by the curves N, P and ND, respectively. (Because the y coordinate is an exponent (n) of 10 where, for example, n=20 is arithmetically greater than n=19 by $9 \times 10^{19}$, the net difference curve ND closely tracks the curve of highest concentration at all points except where the concentrations of the N and P curves are close to one another.)

In FIG. 6, two p-n junctions 42 and 50 are shown where the concentrations of the n and p dopants are equal. At such points, where the n and p curves cross one-another, the net doping curve should fall to zero. FIG. 6, however, is computer generated and, because the actual junctions are along lines having substantially zero width, the junction 42 is displayed in FIG. 6 simply as a cusp spaced at the bottom of the Y-axis and the junction 50, for greater clarity, is not truly represented.

The doping profiles shown in FIG. 6 are quite typical of known devices. Of significance to the present invention is that the p-n junction 42 is known as an "abrupt" junction designated $p^+$-$n^-$ (or, if the conductivity types of the various regions of the device were interchanged, the junction, still an "abrupt" junction, would be designated as $n^+$-$p^-$).

No formal definition exists for the term "abrupt junction" (or the term "graded junction" used hereinafter), nor are formal definitions likely possible owing to the fact that the various terms are used by way of comparison. For purposes of the present description, the terms are used with respect to their effects on avalanche breakdown, as follows.

As previously noted, avalanche breakdown is now well understood and occurs when the electric field intensity within a depletion region encompassing a p-n junction reaches a critical value. What occurs is that, as a p-n junction reverse biasing voltage is increased in amplitude, the depletion region formed at the junction expands in width at a rate determined by the rate of increase of the voltage and the net doping concentrations of the semiconductor regions into which the depletion layer expands. The net fixed charge carriers on each side of the p-n junction exposed by the expanding depletion region provide an electric field, the intensity of which is determined by the number of net exposed fixed carriers. Eventually, with continuing expansion of the depletion region and increasing exposure of fixed charge carriers, the critical electric field intensity is reached and avalanching occurs. The amplitude of the applied reverse biasing voltage when avalanching occurs is a function of the total width of the depletion region. For any given material, avalanching occurs when a given number of net fixed charge carriers is exposed by the expanding depletion region. The width of the depletion region when avalanching finally occurs is thus a function of the net concentration profile of the fixed charges present. The lower the net doping concentration (i.e., the less conductive the material), the greater is the width of the depletion region at avalanching and the greater is the applied voltage necessary to induce avalanching.

Figure 7:
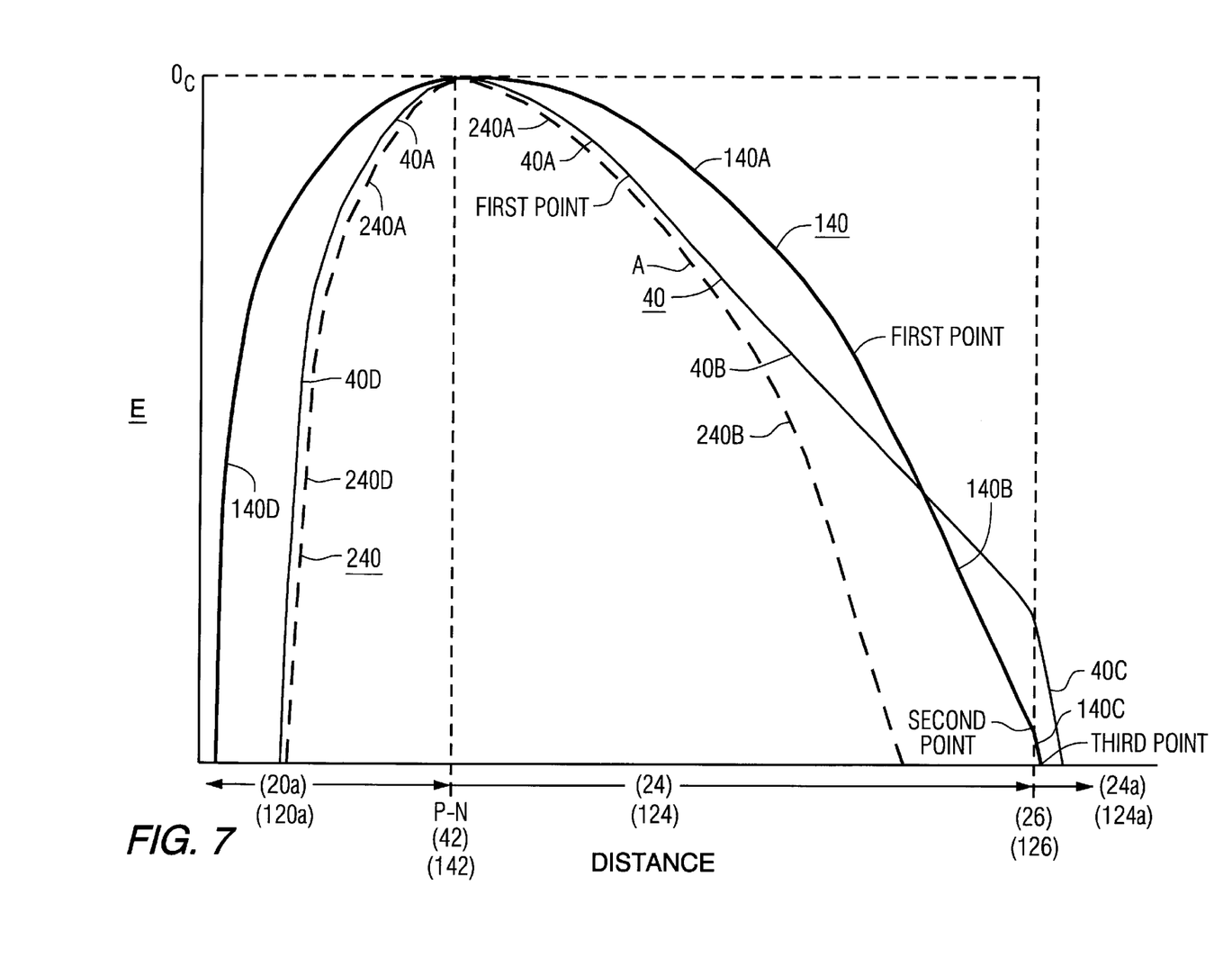
FIG. 7 is a graph plotting electric field intensity versus distance from a reverse biased junction for three different semiconductor devices, each represented by a respective curve.

A simple graph illustrating the foregoing is provided in FIG. 7 wherein electric field intensity E (the graph ordinate) is plotted against distance (the abscissa) from a p-n junction (P-N). Curve 40 (comprising portions A, B, C, D) on the graph shows the condition present in the prior art device 40 when, owing to a continuously increasing reverse biasing voltage applied across the p-n junction 42, avalanching first begins. As previously noted, this condition is also illustrated in FIG. 2 which shows the configuration of the depletion region 43 when avalanching first occurs.

The shape of curve 40 in FIG. 7 is determined by the net doping concentration curve ND shown in FIG. 6. As previously explained, the rate of expansion of a depletion region is a function of the net doping concentration of the material into which the depletion region expands. At the p-n junction 42 itself, the net concentration is zero and the slope of the curve 40 at the p-n junction in FIG. 7 is zero. On either side of the p-n junction, the net concentration ND rapidly rises and the portions A of the curve 40 adjoining the junction 42 have a changing slope. The p-n junction 42 is, as previously noted, an "abrupt" junction. One thing meant by this is that the slope of the dopant curve P is relatively steep (obtained by a high temperature and rapid diffusion process). Thus, within relatively short distances from the p-n junction 42, the net doping present is determined primarily by the relatively high p concentration (in the p region 20a) or by the relatively low n concentration (the background doping) of the $n^-$ layer 24.

Accordingly, to the right of the portion A of the curve 40 adjoining the p-n junction 42 in FIG. 7, a portion B of the curve 40 takes on a uniform slope (owing to the uniform doping of the layer 24) with relatively small steepness (owing to the low background doping concentration of the layer 24). The width of the depletion layer to the right of the p-n junction 42 is thus determined primarily by the low doping of the layer 24, which doping, along with the thickness of the layer 24, are selected such that the depletion region 43 (FIG. 2) spreads all the way across the layer 24 and into the layer 24a when avalanching first occurs.

Owing to the high doping concentration of the layer 24a ($2 \times 10^{19}$ atoms/cm$^3$), the slope of the portion C of the curve 40 within the layer 124a becomes quite high and the field intensity E quickly falls to zero intensity.

Similarly, owing to the relatively high average concentration within the p region 20a, the portion D of the curve 40 also has a relatively high slope to the left of the portion A of the curve 40.

In accordance with known theory, the amplitude of the applied voltage giving rise to the depletion region 43 shown in FIG. 2 is a function of the total area under the curve 40 (A,B,C,D) in FIG. 7. Clearly, most of the applied voltage appears across (or is withstood by) the layer 24, and the doping of the layer 24 primarily determines the voltage rating of the device 40.

The device 40 is deliberately designed such that the depletion region 43 (FIG. 2) spreads entirely across the layer 24 and penetrates the layer 24a. A reason for such design is that the thickness of the layer 24 is a parameter which can be carefully controlled during device manufacture, hence, devices having precisely controlled avalanche breakdown ratings can be reliably manufactured.

Significantly, while the doping concentration of the layer 24 to the right of the p-n junction 42 is affected by the p dopants diffused therein, as a result of the high slope of the p dopant curve P in FIG. 6, the effect is quite small. Accordingly, owing to the low doping concentration of the layer 24, the depletion region 43 spreads entirely across the layer 24 before avalanching occurs. Based upon this, and for purposes of describing the present invention, an abrupt junction is defined as a junction formed by diffusion where avalanche breakdown is not significantly determined by the doping concentrations adjoining the junction, but by the doping concentration of one or more regions spaced from the abrupt junction and into which the depletion region extends at avalanche breakdown. Conversely, a graded junction is defined as a junction where avalanche breakdown is primarily determined by the influence of dopants diffused across the junction. This is further discussed hereinafter.

Another matter of significance illustrated in FIG. 2 is that each of the two depletion regions 43 follows the shape of its respective p-n junction 42 and curves upwardly away from the n$^+$ layer 24a within the drain region neck 34. The width of the neck 34 is considerably greater than the combined width of the two depletion regions 43, with the result being that a gap G between the two depletion regions 43 exists within the neck 34. Because the source to drain voltage drop occurs only within the depletion regions 43, the presence of the gap G means that the gap portion G of the neck 34 plays no part in supporting or withstanding the reverse biasing voltage between the device source and drain source regions.

During operation of the device (as previously described in connection with FIG. 2), current is from the source regions 22 through the channel regions 20 into and through the drain region 24 as shown generally by the arrows 25. The IR drop through the drain region 24 and the I$^2$R heating through the drain region are determined primarily (for given voltages and currents) by the resistivity of the neck 34. In the known device 40, the resistivity of the neck is substantially uniform. However, because, as above explained, the gap portion G of the neck 34 does not support any voltage drop, there is no need for high resistivity material in this portion. Accordingly, the presence of such high resistivity material in the gap portion G of the neck unnecessarily increases the device IR drop and I$^2$R heating. Because of this and as recognized by the inventor, improvements in device performance can be obtained by increasing the conductivity of those portions of the drain neck 34 which do not support any voltage drop.

The fabrication of devices according to the invention is now described. For comparison purposes, the invention is described in connection with the fabrication of a device 140 (FIG. 9) substantially identical to the known device 40 shown in FIGS. 1 and 2 and made using processes substantially identical to those used for the known device 40.

Figure 3:
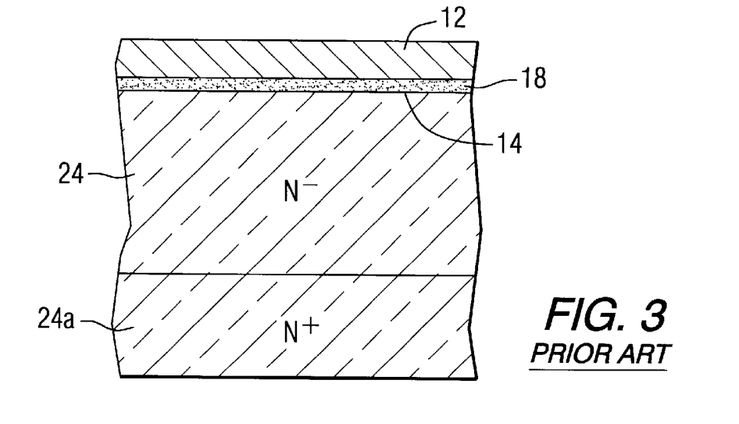
FIGS. 3–5 are views, in section, of a portion of a semiconductor workpiece at successive stages in the fabrication of the device shown in FIGS. 1 and 2.
Figure 8:
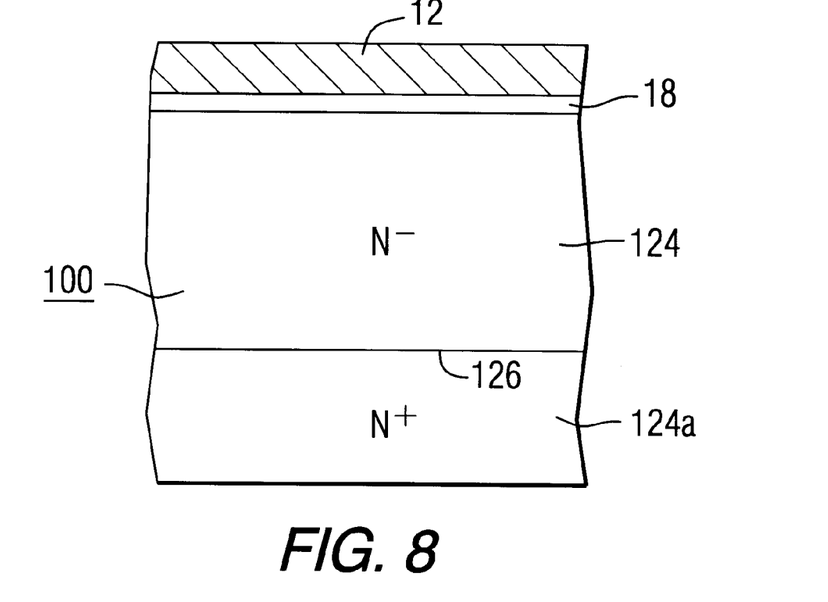
FIGS. 8–10 are views similar to FIGS. 3, 4 and 6, respectively, but illustrating various aspects of a device made according to the present invention.

A starting workpiece 100 is shown in FIG. 8 which is identical to the workpiece shown in FIG. 3 except that an n type layer 124 is provided which is more heavily doped than the layer 24, e.g., at a uniform concentration of $1.2 \times 10^{17}$ atoms/cm$^3$ versus the concentration of $2.8 \times 10^{16}$ atoms/cm$^3$ for the layer 24. In terms of resistivity, the layer 124 has a resistivity of 0.021 ohm/cm versus a resistivity of 0.075 ohm/cm of the layer 24.

Figure 4:
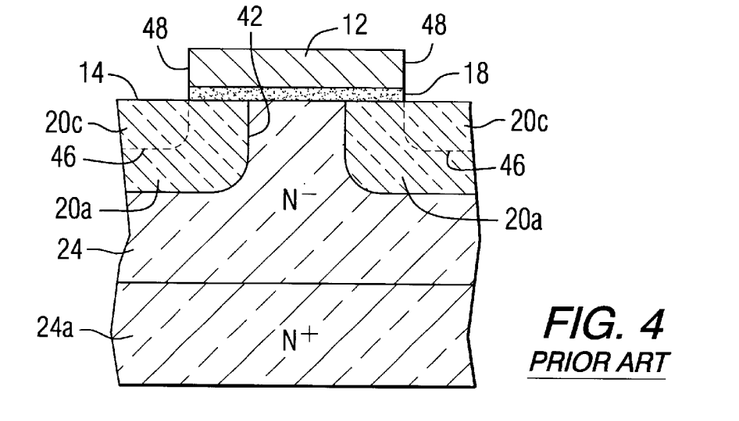
Figure 9:
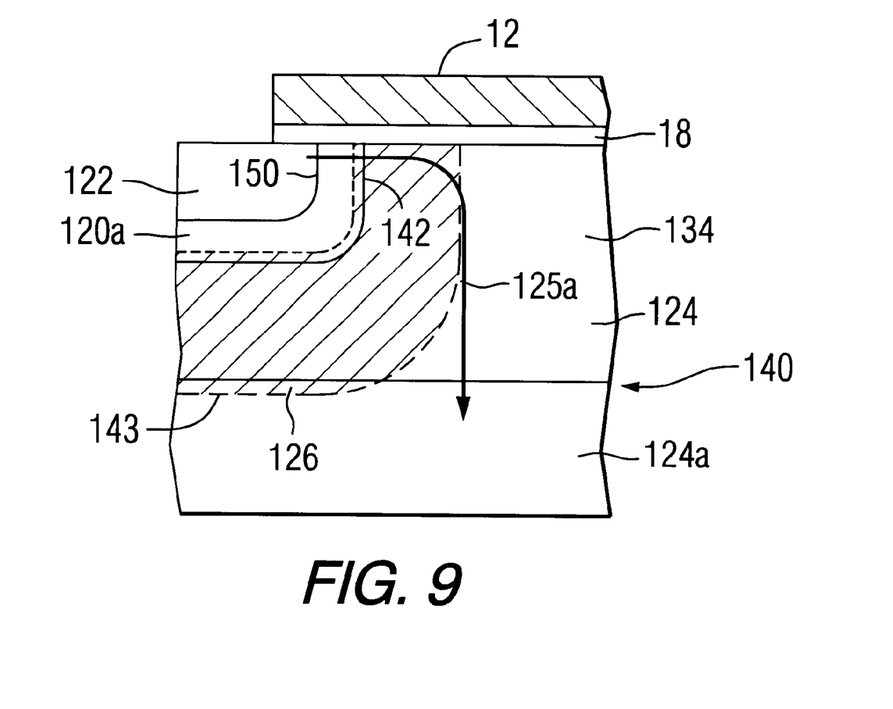

The next steps in the processing of the workpiece are substantially identical to the steps shown in FIGS. 4 and 5 except that the doping and the subsequent diffusion steps are different from those used in the known device 40. The results are shown in FIG. 9 which is quite similar in appearance to FIG. 5. Of importance, the highly precise "self-alignment" processes used for the prior art workpiece are used in the inventive process for similar highly precise results.

Thus, starting with the workpiece 100 shown in FIG. 8, a p-type dopant (e.g., boron as in the FIG. 4 device) is ion implanted at a concentration of $1.1 \times 10^{14}$ atom/cm$^2$ to a depth of 0.25 μm. This implantation is different from that used with the known device 40 where (typically, and for purposes of comparison with the illustrative inventive device) boron atoms are ion implanted at a concentration of $7 \times 10^{13}$ to a depth of 0.25 μm. Then, in the inventive process, the implanted p-type region is diffused into the substrate to form a p-body region 120a (FIG. 9) forming a p-n junction 142 with the n-type drain region 124. Of significance, the diffusion process used results in the formation of a "graded" junction 142 rather than an "abrupt" junction as at 42 in the known device 40. The desired type of junction is obtained by selection of the parameters of the heating process used to diffuse the implanted ions. This is generally known. In the inventive device 140, the diffusion is performed using the following sequence of heating steps; temperature ramp-up to 1,150° C., 210 minutes drive at 1,150° C. and temperature ramp-down to 800° C.

In the known device 40, the corresponding diffusion profile is:

Temperature ramp-up to 1,100° C., 160 minutes drive at 1,100° C., and temperature ramp-down to 800° C.

After the diffusion of the p-type region 120a, an n-type source region 122 is formed preferably precisely as the source region 22 of the prior art device is formed.

Figure 10:
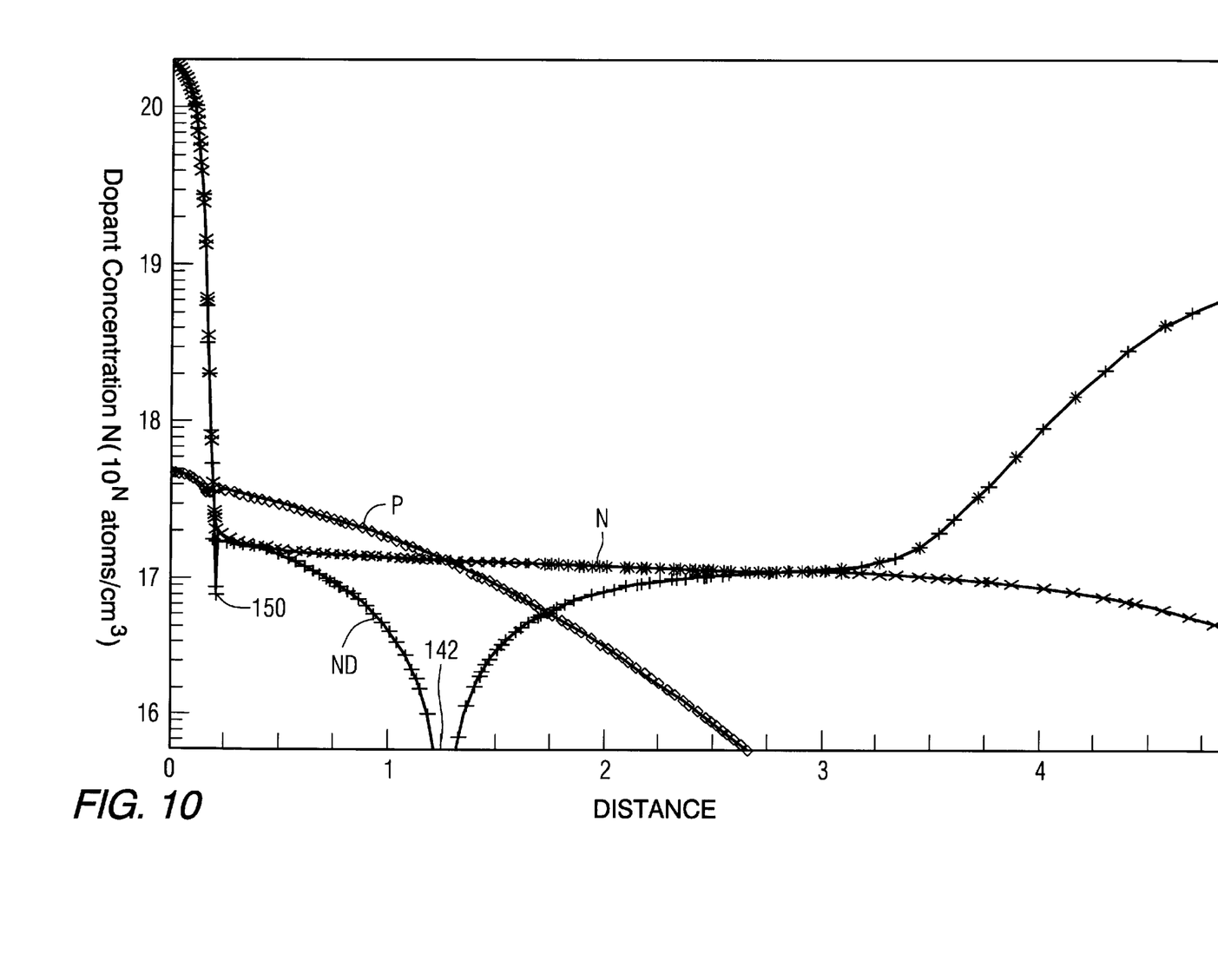

Summarizing the foregoing, the p well 120a of the inventive device 140 is initially implanted with a higher concentration of dopants than the p well 20a in the known device 40, and a more extensive diffusion is carried out for extending the initially implanted region further into the substrate. The doping profile for the inventive device 140, corresponding to that shown in FIG. 6 for the known device 40 is shown in FIG. 10. (Note that, in FIG. 10, the net doping curve ND shows a cusp corresponding to the junction 150, as well as indicating that the dopant concentration at the junction 142 does indeed become quite low, i.e., zero, as above noted.)

Comparing FIGS. 6 and 10, the p dopant curve P in FIG. 6 has a steep slope and intersects the horizontal portion of the n dopant curve N at a relatively large angle. Thus, as previously explained, an "abrupt" junction is present where, to either side of the p-n junction 42, the net dopant curve ND quickly rises to the concentration of the conductivity type determining dopant there present (the p dopant on the P side of the junction 42 and the n dopant on the n side of the junction.).

In FIG. 10 (for the inventive device 140), the p dopant curve P has a gradual slope and intersects the horizontal portion of the n dopant curve N at a relatively shallow angle. A "graded" p-n junction 142 is thus provided where, to either side of the p-n junction 142, the shape of the net dopant curve ND is influenced over relatively long distances from the p-n junction 142 by both dopants present. That is, in comparison with FIG. 6, on either side of the p-n junction, the net dopant concentration curve ND rises relatively slowly towards the concentration of the conductivity type determining dopant. Most significantly, on the n side of the p-n junction 142, although the background doping concentration (of the layer 124) is the aforementioned $1.2 \times 10^{17}$ atoms/cm$^3$, the net doping concentration on the n side of the p-n junction remains below the background doping level for about 90% of the total thickness of the layer 124. In contrast, the net doping, in FIG. 6, reaches the background doping level within only 26% of the thickness of the layer 24. The significance of the difference is explained in connection with FIG. 7 as follows.

As described, curve 40 (A,B,C,d) of FIG. 7 shows a plot of electric field intensity versus distance from the p-n junction 42 of the prior art device 40 when the reverse biasing voltage is first high enough to cause avalanche breakdown. At this time, the maximum electric field intensity is the aforementioned critical intensity.

Curve 140 (A,B,C,D) in FIG. 7 corresponds to the electric field intensity distribution in the inventive device 140 under similar avalanching conditions (the maximum intensity of the curve 140 also being the critical intensity at which avalanching occurs). For convenience of comparison, the horizontal dimensions of the curve 140 are made to coincide with the horizontal dimensions of the curve 40. Owing to the different dopings and diffusions used in the respective devices 40 and 140, different horizontal dimensions can actually be present, but any dimensional inaccuracies of FIG. 7 can be ignored for the present explanatory purposes.

Curve 40 in FIG. 7 is based upon the net dopant concentration profile (ND) shown in FIG. 6, and curve 140 in FIG. 7 is similarly dependent on the net dopant concentration profile shown in FIG. 10.

Immediately to the right of the junction 142 shown in FIG. 10, the net dopant concentration begins to rise towards the background dopant concentration (of $1.2 \times 10^{17}$). Because the rate of increase is relatively slow, in comparison to the rate of increase shown in FIG. 6, a portion A of the curve 140 (FIG. 7) has initial slopes less steep than that of the comparable portion A of the curve 40. Eventually, the ND curve in FIG. 10 reaches the uniform n doping level of layer 124, and the slope of the curve 140 assumes, along portion B thereof, a uniform slope. Because the uniform doping of the n layer 124 of the inventive device is greater than the uniform doping of the prior art device 40, the slope of the corresponding portion B of curve 40 of uniform slope is less than that of portion B of curve 140.

In FIG. 2, showing the known device 40, the depletion region 43 extends entirely across the layer 24 (at the condition of initial avalanching) and into the layer 24a. This is also indicated in FIG. 7 where the portion C of curve 40, corresponding to the extension of the depletion region 43 into the highly doped layer 24a, has a quite high slope and quickly drops to zero electric field intensity.

The inventive device 140 is preferably similarly designed such that, at avalanching, a depletion region 143 (FIG. 9) similarly extends entirely across the layer 124 and penetrates the layer 24a. Accordingly, curve 140 in FIG. 7 also includes a portion C of quite high slope falling quickly to zero electric field intensity.

As previously mentioned, and as generally known, the amplitude of an applied reverse biasing voltage giving rise to the electric field intensity variations shown by the respective curves 40 and 140 in FIG. 7 is a function of the area (A,B,C,D) under the curves. Comparing the two curves 40 and 140, it is seen, qualitatively, that the encompassed areas are about the same. Thus, while the portions B and C of the curve 140 encompass less area than the portions B and C of the curve 40, greater area is encompassed by portion A of curve 140 than by portion A of curve 40.

The equal areas covered by the two curves 140 and 40 mean that the avalanching voltage rating of the device 140 is comparable to that of the known device 40. Basically, this comes about because, whereas the background n type doping of the drain region layer 124 of the inventive device 40 is higher than that of the drain region layer 24 of the known device 40, as a result of the graded junction in the inventive drain region, a relatively large number of p dopants extend deeply into the drain region layer 124 for greatly reducing the net conductivity of a relatively wide region of the layer 124 immediately to the right (in FIG. 6) of the p-n junction 142. This low conductivity portion of the drain region layer 124 significantly contributes to the voltage blocking capability of the inventive device and is the basis for the previously stated definition, for purposes of this invention, of a graded junction.

Stated slightly differently, the use of a graded junction, according to the present invention, allows the use of a drain region layer 124 having a higher background doping concentration than used in known devices but without loss of avalanching voltage capability. In such known devices, if, for example, the conductivity of the layer 24 is increased, but with no other changes (including the continued use of an abrupt junction 42), the effect of such increased conductivity is shown by curve 240 (A,B,C) in FIG. 7. The higher conductivity of the layer 24 results in the slope of the portion B being greater. This results in the depletion layer within the drain region layer 24 being less wide and, in this example, not reaching to the layer 24a. In any event, the area under the curve 240 is less than that under the curve 40, hence increasing the conductivity of the drain region layer 24 results in a lower avalanching voltage capability of the known device.

The advantage of using a drain region 124 of higher conductivity (while avoiding loss of avalanching voltage capability) is evident from previously discussed FIG. 9. During device operation in its "on", conductive state, current flows into the drain region neck portion 134 as indicated by the arrow 125 (similarly as in the known device 40 shown in FIG. 2) and thence downwardly to the highly doped layer 124a. The neck portion 134 is spaced well away from the p-n junction 142 and well away from the high concentrations of p dopants diffused across the p-n junction 142. Thus, the net dopant concentration present in the neck portion 134 is that of the relatively heavily doped n layer 124 (in comparison with the less heavily doped n$^-$ layer 24 in the prior art device 40), hence, the resistance of the path for current through the drain region portion 134 of the inventive device is less than that through the drain region portion 34 of the known device 40. Accordingly, a lower IR voltage drop and a lower $I^2R$ heating is obtained.

The foregoing is summarized as follows:

As previously explained, in the illustrative inventive device 140, the net doping concentration within (FIG. 9) the drain region 124 gradually increases with distance from the p-n junction 142 and does not reach the background doping level of the layer 124 for about 90% of the total thickness of the layer 124. Conversely, the net doping level in the drain region 24 of the illustrative prior art device reaches the background doping level within only 26% of the thickness of the layer 24. While these percentages are by way of example only, they do come about by the afore-explained differences in the fabrication of the known and inventive devices. Accordingly, for the purpose of distinguishing the inventive devices from the known devices, a graded junction is defined as one where the net doping concentration in the drain region does not reach the background doping of the drain region until at least 50% of the thickness of the lower conductivity one of the two layers forming the drain region.

For providing one means for claiming the invention, the foregoing definition is "plotted" on the curve 140 shown in FIG. 7. As previously noted, portion 140A of the curve 140 (corresponding to the inventive device shown in FIG. 9) has a variable slope until the corresponding net doping curve ND shown in FIG. 10 reaches the uniform (background) doping level of the layer 124. At this point, identified as the "first point" in FIG. 7, the slope of the curve 140 assumes, along portion B (140B) thereof, a uniform slope. In terms of the foregoing definition, this "first point", where the net doping concentration reaches the background doping of the drain region 124, occurs within the drain region 124 at a distance from the p-n junction at least in excess of 50% of the thickness of the drain region 124. In FIG. 9, the drain region 124 extends between the junctions 142 and 126. FIG. 7 also shows the location of the junction 126, hence the drain region 124 is shown in FIG. 7 as having a thickness extending between the junctions 142 and 126. Where the curve 140B reaches the junction 126 is identified as the "second point".

Considering FIG. 7, the "first point" is clearly more than 50% of the distance (the thickness of the drain region) of the p-n junction to the "second point". Accordingly, the foregoing definition of a graded junction is illustrated in FIG. 7 for the curve 140 corresponding to the inventive device shown in FIG. 9. Conversely, curve 40 in FIG. 7 corresponds to the prior art device shown in FIG. 2. The intersection of the curve portions 40A and 40B is also identified as a "first point" where the net doping concentration in the drain region 24 reaches the background doping concentration of the drain region 24. Clearly, the first point is spaced less than 50% of the thickness of the drain region 24 (extending from the junctions 42 and 26), hence the junction 42 ia not a graded junction in accordance with the foregoing definition.

FIG. 7 also shows a "third point". Such third point is where the curve 140C intersects the X-axis and corresponds to the maximum spread of the depletion region 143 into the drain region 124a at the start of avalanching.

Another way of distinguishing the invention from the prior art is as follows:

Using fictitious, simple numbers, avalanching occurs when a given number of net fixed charges, say 100, is uncovered on each side of the p-n junction. For a desired voltage rating, a total depletion layer width of, say, 10 width units is required. For simplicity, the entire width is assumed to be on the drain region side of the p-n junction. The average net fixed charge concentration is thus 10 fixed charges per width unit. With. an abrupt junction, the net fixed charge concentration abruptly rises from zero at the junction to the background doping concentration, hence, the background doping concentration must be close to the average concentration of 10.

With a graded junction, according to the invention, however, the net fixed concentration charge rises slowly whereby, for a substantial portion of the depletion layer width, the net concentration present is less than the background doping concentration. The result of this is that the doping concentration does not reach the background concentration until, for example, midway of the width of the depletion layer, with, for example, the total number of net fixed charges present in the first half of the depletion layer being only 25. Accordingly, the second half of the depletion layer can contain 75 fixed charges, for an average concentration, corresponding to the background concentration, of 15 charges per width unit (75 divided by 5). The higher background doping possible in the drain region of the inventive device provides, as previously explained, lower resistance to current flow through the device.

For purposes of defining the invention, it is possible to distinguish between a graded junction device and an abrupt junction device, both having the same avalanching voltage rating, by specifying the ratio of the drain region background doping concentration to the average doping concentration actually present in the depletion region within the drain region at the onset of avalanching. In the foregoing illustrative (and quite fictitious) example, the ratio is 1.5 (15 divided by 10) for the graded junction device versus 1.0 (10 divided by 10) for the abrupt junction device. Accordingly, somewhat arbitrarily, and based upon applicant's general knowledge of the prior art (but without claim of knowing all the prior art), MOS gated devices of the type herein described are characterized as having a graded p-n junction between the device channel and a drain region having a uniform background doping concentration such that, upon the onset of avalanching, the ratio of the uniform background doping concentration to the average net fixed charge concentration within the drain region portion of the depletion layer is in excess of 1.1.

One significance of the foregoing example is that it defines a graded junction solely in terms of the width of the depletion region at the on-set of avalanching rather than in terms of the thickness of the drain region.

What is claimed is:

1. An MOS gated semiconductor device comprising a substrate having a surface, source and drain regions in said substrate at said surface separated by a channel region, said channel and said drain regions adjoining one another at a p-n junction, there being, during operation of said device, a path for current from said source region through said channel region and past first and second successive points in said drain region spaced at respectively greater first and second distances from said p-n junction, said drain region containing dopant atoms of both conductivity types providing a net quantity of fixed charges, the net concentration of said fixed charges being a minimum at said junction and rising continuously with increasing distance from said junction to said first point such that, upon the onset of an avalanching condition caused by the reverse biasing of said p-n junction. a depletion layer spreads into said drain region a maximum distance from said p-n junction past said first point to said second point, where, from said first point towards said second point, a uniform concentration of net fixed charges is present, and said first distance of said first point from said p-n junction is at least 50% of said second distance of said second point from said p-n junction.

2. A device according to claim 1 wherein said current path passes from said second point through a drain region third point spaced from said p-n junction a third distance greater than said second distance, and the net concentration of said fixed charges in said drain region between said second and third points being greater than said uniform net concentration between said first and second points.

3. A device according to claim 2 wherein during voltage blocking operation of said device and reverse biasing of said p-n junction, the total number of net fixed charges along said current path from said p-n junction to said second point is less than a critical number of net fixed charges giving rise to avalanche voltage breakdown.

4. A device according to claim 3 wherein the total number of net fixed charges along said current path to said third point is equal to said critical number.

5. A device according to claim 4 wherein said channel region is disposed in a first body region forming a well extending inwardly of said substrate surface and in which is disposed said source region, said first and second points of said drain region lying within a first layer of said substrate in which is disposed said body region, said first layer portion overlying a second layer portion of said substrate, and said third point lying within said second layer portion adjacent to an interface between said first and second layer portions of said substrate.

6. A device according to claim 5 including a second body region disposed within said first layer portion of said substrate, said second body region being spaced from said first body region by an intervening neck portion of said first layer portion extending to said substrate surface, said second body region forming a second p-n junction with said first layer portion and including a source region spaced from said p-n junction by a channel region portion of said second body, said second body region and said source and channel regions therein being identical to said first body region and said source and drain regions within said first body region, and the spacing between said body regions being such that said neck portion includes, from said substrate surface to said interface between said first and second substrate layer portions, a path for current from both said body regions along which the concentration of net fixed charges is said uniform net concentration.

7. An MOS gated semiconductor device comprising a first body of semiconductor material including source and first drain regions separated by a channel region, said channel and drain regions adjoining one another at a p-n junction where the net fixed charge concentration within said drain region increases with distance from said junction into said drain region, and said drain region having a uniform background doping concentration such that, upon the onset of an avalanching condition caused by the reverse biasing of said p-n junction and the spread of a depletion layer into said drain region, the ratio of the uniform background doping concentration of the drain region to the average net fixed charge concentration within said depletion layer is in excess of 1.1.

* * * * *